United States Patent [19]

Catherwood, Sr.

[11] Patent Number: 4,594,082

[45] Date of Patent: Jun. 10, 1986

[54] DEHYDRATING AIR-FILTERING APPARATUS

[75] Inventor: Robert Catherwood, Sr., Honeoye Falls, N.Y.

[73] Assignee: Harris Corporation, Melbourne, Fla.

[21] Appl. No.: 672,547

[22] Filed: Nov. 19, 1984

[51] Int. Cl.⁴ ............................................. B01D 53/02
[52] U.S. Cl. ...................................... 55/316; 55/318; 55/387; 55/388
[58] Field of Search ...................... 55/33, 35, 316, 318, 55/387, 385 C, 385 E, 388; 220/371, 372

[56] References Cited

U.S. PATENT DOCUMENTS

| | | | |
|---|---|---|---|
| 2,735,964 | 2/1956 | Grieve et al. | 55/385 E X |
| 3,853,475 | 12/1974 | Gordon et al. | 55/387 X |
| 3,888,644 | 6/1975 | Holland et al. | 55/318 |
| 3,950,155 | 4/1976 | Komiyama | 55/316 X |
| 4,015,959 | 4/1977 | Grote | 55/318 X |
| 4,374,655 | 2/1983 | Grodzka et al. | 55/387 X |
| 4,504,289 | 3/1985 | Waller | 55/316 |

*Primary Examiner*—Charles Hart
*Attorney, Agent, or Firm*—Charles C. Krawczyk; John L. DeAngelis, Jr.

[57] ABSTRACT

A filtering apparatus for reducing problems due to water condensation in mobile or portable electronic instruments through the use of a controlled air path into an otherwise sealed enclosure. The apparatus includes a screen with a fine mesh for condensing water particles contained in the air that flows through the path with the screen positioned so that the condensed water flows out of the enclosure, and a dehydrating material located in series with the screen for absorbing additional moisture from the air. The apparatus is designed to fit almost entirely within the enclosure while being readily accessible for easy replacing of the filtering components.

19 Claims, 15 Drawing Figures

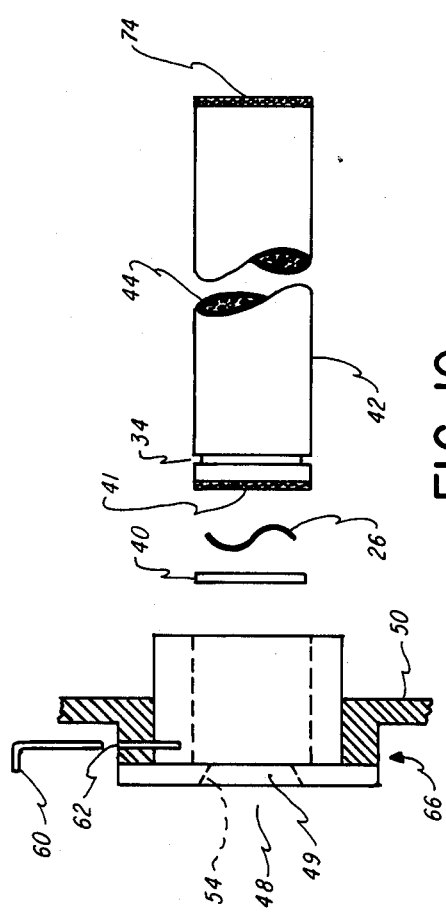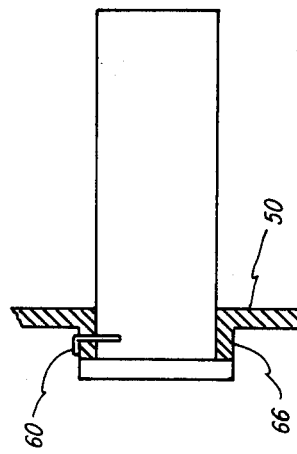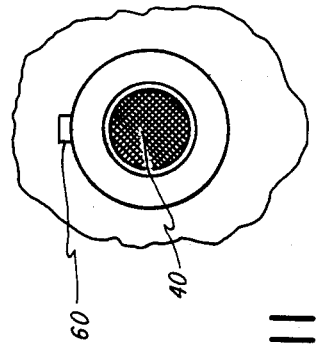

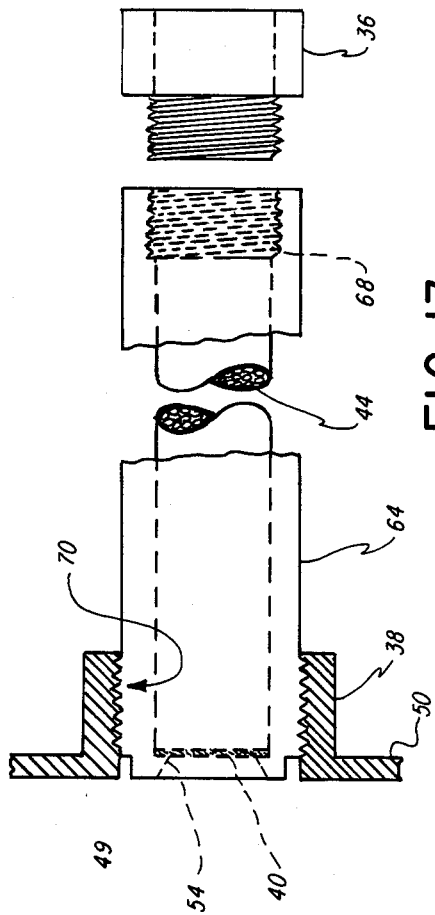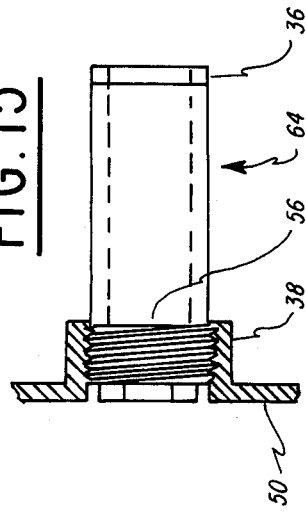

DEHYDRATING AIR-FILTERING APPARATUS

BACKGROUND OF INVENTION

Electronic instrumentation can become inoperable due to the moisture in the air condensing within the instrument housing, causing corrosion within the electronic circuitry and possible shorting between the electronic components. This problem is of particular concern for electronic instrumentation used in humid, jungle type environments having warm days and cool nights, or carried through mountainous regions which exposes the instrument to changing pressures and temperatures. The condensation within an instrument is typically caused by an increase in pressure or decrease in temperature about the instrument.

One possible solution to eliminate this problem is to hermetically seal the instrument so as to attempt to prevent moisture from entering the housing. This solution, however, has been found to still have problems since no seal is perfect. Changes in pressure or temperature will cause even a hermetically sealed housing to expand and contract creating an intense force on the seal and eventually allowing air and the accompanying water vapor to seep into the container. Although some of this air and moisture will be exhausted as the instrument is exposed to lower temperatures, some condensation of the vapor will still occur within the instrument. This condensation becomes accumulative as the container expands and contracts over a period of time. The hermetic seal can in itself become a problem due to periodic maintenance or calibration cycles that require the intermittent breaking of the seals thereby weakening its ability to provide a proper seal. Further, there is always the possibility of aggravated situations due to improper reinstallation of the seal. Additionally, exposure to constant humidity and heat can cause the seals to deteriorate at much faster rates requiring the frequent replacement of the seals in order to prevent accumulation of water vapor into the instrument.

Although moisture filtering devices have been previously disclosed for use with electronic instruments, none of the prior art filters have been concerned with the needs associated with the portability and interchangeability associated with electronic instruments such as radio frequency transceivers. Usually these radio frequency units are rack mounted, self-contained units that automatically connect to electrical connectors and require a minimum number of other connections for quick and simple replacement. An example of a filtering device for controlling humidity in electronic equipment of the prior art is the U.S. Pat. No. 3,906,798, which discloses a filter adapted for use with instrumentation in aircraft, wherein the instrument was located in a panel and the filter located external to the instrument separately connected thereto. Such devices are not readily adaptable to portable equipment such as radio transmitters and receivers which are either hand carried or rack mounted in a vehicle. The need for portable electronic equipment to be as compact as possible requires a filtering device to extend within the instrument. Any extending filtering device would hamper the instrument's installation and mobility.

SUMMARY OF THE INVENTION

It is therefore an object of this invention to provide a new and improved water vapor filter for portable electronic instruments.

It is also an object of this invention to provide a new and improved water vapor filter for portable electronic instruments which is located within the instrument thereby maintaining the instruments mobility.

It is also an object of this invention to provide a new and improved filter for removing water vapor from electronic instruments by controlling the air flow into and out of an otherwise sealed instrument.

It is further an object to provide a new and improved water vapor filter for electronic instrumentation that is readily accessible for easy changing of the filtering components during maintenance periods or more often if necessary, depending upon the humidity in the environment and the equipment use, as well as temperature and altitude changes.

The present invention reduces the problems with moisture in mobile or portable equipment by controlling the path of air flow in and out of an otherwise sealed instrument housing while filtering the moisture in the air flow through the path. The configuration of the filter apparatus is such that it is an integral part of the instrument housing by fitting within the instrument enclosure. The filter includes a fine mesh screen which causes water droplets to form on the screen as humid air passes through it. The water droplets flow down the mesh under gravity and then out of the housing. Additional water vapor in the air is then absorbed in a desiccant of a static dehydrator as air passes through the controlled path to the inside of the instrument housing. The use of the mesh screen in removing some of the moisture prior to the flow through the dehydrator, extends the useful life of the desiccant material. The apparatus is designed such that it is easily removable for cleaning the screen or replacing the desiccant either with or without opening the instrument housing.

The foregoing features of the invention, along with additional advantages thereof, will be seen in the ensuing description and claims which are to be taken in conjunction with the accompanying drawing.

THE DRAWINGS

FIG. 10 is an exploded view of the forth embodiment of the present invention.

FIG. 11 is a front elevational view of the entry portion of the filtering apparatus shown in FIG. 10.

FIG. 12 is a side elevational view of the filtering apparatus shown in FIG. 10 in assembled form.

FIG. 13 is an exploded view of a fifth embodiment of the present invention in assembled form.

FIG. 14 is a front elevational view of the entering portion of the filtering apparatus shown in FIG. 13.

FIG. 15 is a side elevational view of the filtering apparatus shown in FIG. 13.

DESCRIPTION OF THE PREFERRED EMBODIMENTS

Reference is now made to the drawings which illustrate several of the preferred embodiments.

Figure 1:
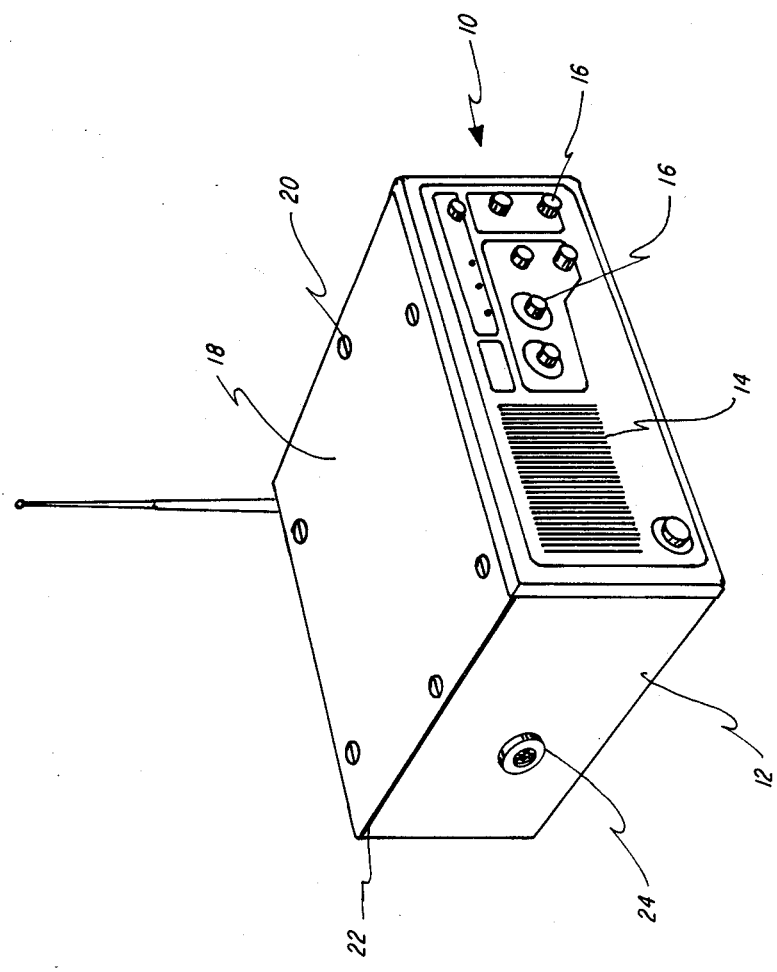
FIG. 1 is a perspective view of a radio communications device utilizing the present invention.

FIG. 1 shows radio frequency communications instrument 10 such as a radio transceiver contained within a sealed container 12, with a speaker 14 and dials 16 sealed within the instrument. The arrangement is such that the speaker and dials have sealed mountings and/or rings such as to reduce the air flow into the unit. In addition, the speaker and dials can be located within a separate compartment that is sealed from higher voltage, more sensitive units with only electrical connections extending between the compartments. The top 18 of the instrument housing is fastened to the rest of the housing through the use of several screws 20, with a flexible seal 22 positioned in between so that the unit is sealed except for the air-filtering apparatus 24 embodying the principles of the present invention which extends through one of the sides of the instrument housing. Although the air filter 24 is illustrated as extending through a side, it could also extend through the bottom. The air filter 24 provides a controlled air path for flow of air into and out of the instrument. The instrument itself is of the type that can be hand carried or rack mounted for transporting in marine vessels, aircraft or land vehicles.

Figure 2:
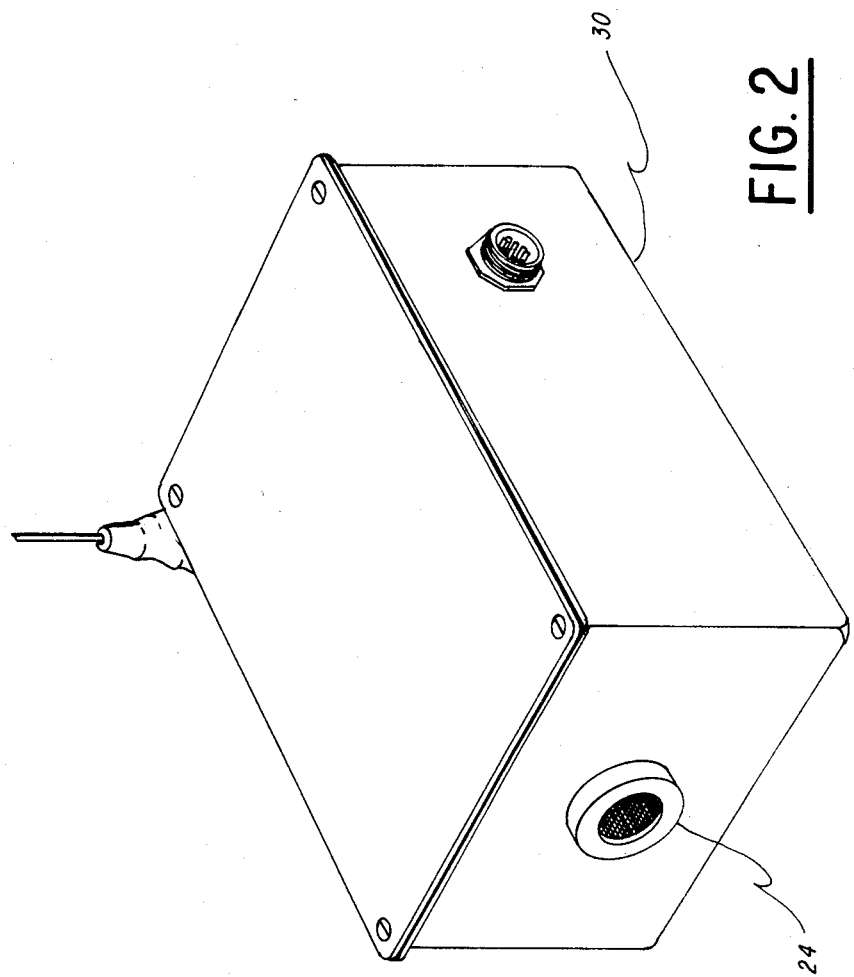
FIG. 2 is a perspective view of an antenna coupler for radio frequency communication devices utilizing the present invention.

FIG. 2 shows an RF antenna coupler 30, having its electronic components enclosed within the instrument along with the air-filtering apparatus 24 embodying the principles of the present invention extending through one of the sides of the equipment housing. Because the antenna coupler 30 uses higher voltages than other typical communication instruments, the problems arising from condensation of water vapor within the instrument are amplified. As in the case of the transceiver of FIG. 1, the antenna coupler is also a sealed container except for the air filter 24.

Referring to FIGS. 3, 4, 7 and 10, the filtering apparatus 24 includes a mesh screen 40, a tubular container 42 filled with a dehydrating material 44, and a mounting means 48 which extends through an aperture 49, through the enclosure side 50 and into the instrument housing. The ends 41 and 74 of the container 42 include a screen to allow the air flow through the container while retaining the dehydrating material 44. The screen 40, container 42, and mounting means 48, are positioned in series with the aperture 49 providing a controlled air path into and out of the enclosure. A sealing member 52 may also be disposed in between the aperture and screen for preventing moisture from circumventing the screen. As the temperature surrounding the unit changes, or the altitude changes air flows through the filtering apparatus. Air entering the unit first passes through the mesh screen 40, and then the container 42 filled with the dehydrating material 44.

The screen 40 is adapted to condense water particles that are contained in humid air flowing through it. It is constructed of a corrosive resistant material such as stainless steel wire with the wire mesh having dimensions ranging between approximately 200×1400 and 100×700 openings per inch. The use of the screen has the effect of prolonging the effectiveness of the dehydrating material by reducing the amount of the humidity from entering the container filled with the material. The mesh is designed such that it prevents moisture in the form of water particles having a size in proportion to the screen mesh from passing through it, thereby causing the water to coalesce and condense. The condensed water accumulates overtime forming larger water droplets which drip down the mesh due to gravity and out the mounting means 48 to the exterior of the housing. The sides of inner cavity of the mounting means leading from the screen to the exterior can be beveled 54 (FIGS. 4, 7, 10 and 13) so as to facilitate the flow of water from the screen to the exterior.

Most of the remainder of the water vapor present in the air is then absorbed by the dehydrating material 44 contained within the container 42. The dehydrating material may consist of any commercially available desiccant such as those desiccants distributed by Dynatech Frontier Corporation. A silica gel desiccant may be preferred specifically as opposed to a molecular sieving material, because of its capability of absorbing water vapor from an unforced air flow. An additional advantage to using a silica gel desiccant is its ability to be recycled by simply removing it and allowing it to dry out under heat. The commercially available desiccants also come with moisture indicators which will change color as the desiccant becomes saturated with moisture, thereby indicating when the desiccant needs changing or drying out. The moisture capacity of the desiccant typically ranges between 0.005 lb. to 0.0015 lb. Dessicants can reduce the water content of the air which is at 1 atm, 80° F. dew point, and 53% relative humidity, by a factor of 50 to a dew piont of about 0° F.

The containers of the desiccant are also commercially available coming in various cartridge packages such as those manufactured by Dynatech Frontier Corporation. The container may be of a plastic material so that the moisture indicator of the desiccant can be readily seen. The non-disposable commercial containers 42 typically have a detachable end opposite the end adjacent to the screen thereby providing a means for replacing the dehydrating material when the moisture indicator indicates such is needed. Depending upon the type of embodiment the user desires, the container may or may not need modification. If the embodiment shown in FIGS. 3 or 10 is chosen, then a circular indentation 34 about one the ends of the container is required.

As can be seen, in contrast to the usual means used in the prior art to attempt to minimize the amount of air flow in and out of portable electronic equipment due to expansion and compression forces through the use of elaborate sealing methods, the invention allows such otherwise sealed containers to breathe freely, however achieving the desired results by controlling the moisture content in the air without hampering the portability of the equipment.

Figure 3:
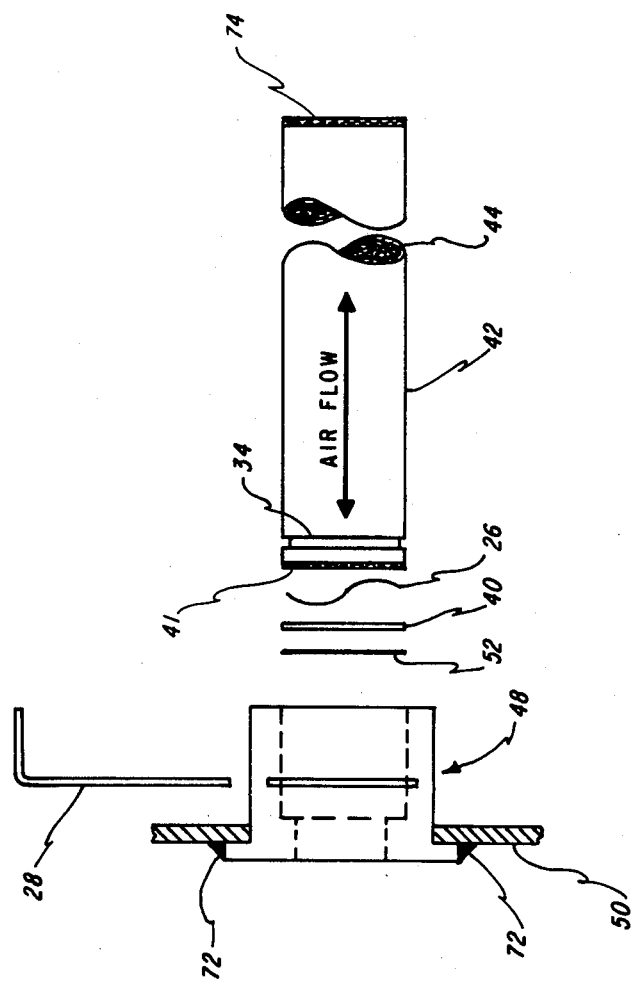
FIG. 3 is an exploded view of a first embodiment of the present invention.
Figure 4:
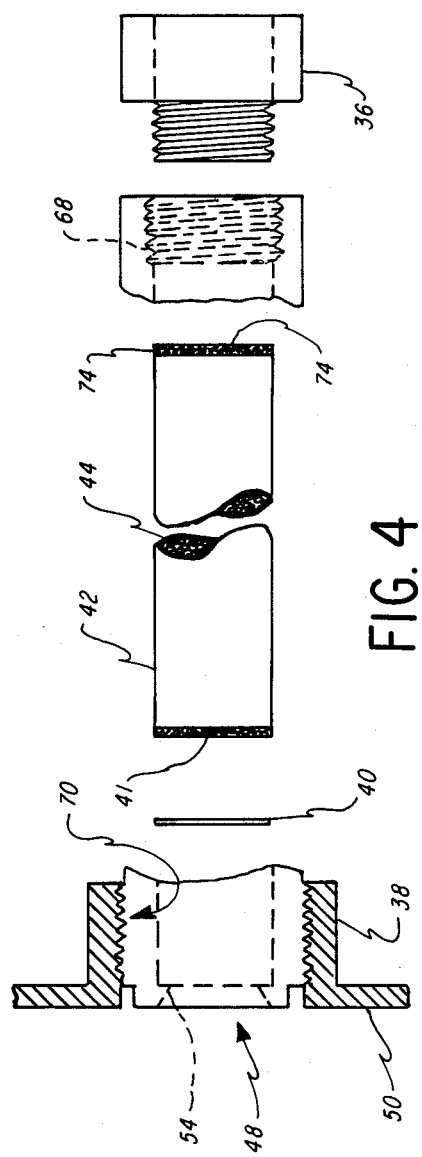
FIG. 4 is an exploded view of a second embodiment of the present invention.

Referring to FIG. 3, the screen 40 and container 42 are secured to the mounting means 48 by a "U" shaped clip 28. The mounting means is formed with two vertically oriented grooves 32 opposite each other on the exterior of the means 48 which penetrate through to the interior of the axial opening. The container which holds the dehydrating material, is formed with a circular indentation 34 about its exterior near the end adjacent to the screen. As the "U" clip 28 engages in the grooves 32 of the mounting means, it will grip onto the container through the grooves where it penetrates the mounting means, fitting within the indentation of the container, and thereby securing the screen and container to the mounting means. The mounting means itself may be permanently attached to the enclosure either by gluing or welding 72. A resilient washer 26 may be disposed in between the screen 40 and container 42 to form a tighter fit between the components.

The embodiment in FIG. 10 is similar to that shown in FIG. 3 but an "L" shaped pin 60 is utilized to secure the screen 40 and container 42 to the mounting means 48. The pin is placed inside an opening 62 formed in a flange extension 66 of the exterior wall 50 of the instrument housing. The opening for the pin is positioned exterior to the housing for easy removal of the pin and filtering apparatus. The filtering apparatus is capable of being removed from the instrument housing for replacing the desiccant without ever having to remove the instrument from its rack mount or back pack, or discontinuing the instrument's operation.

Figure 6:
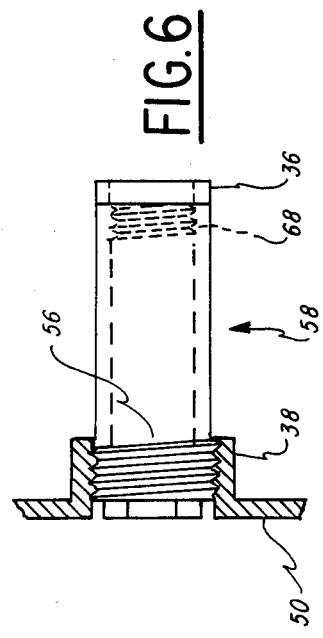
FIG. 6 is a side elevational view of the filtering apparatus shown in FIG. 4 in assembled form.
Figure 5:
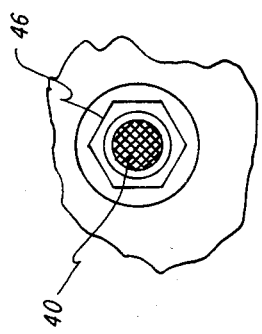
FIG. 5 is a front elevational view of the entry portion of the filtering apparatus shown in FIG. 4.
Figure 7:
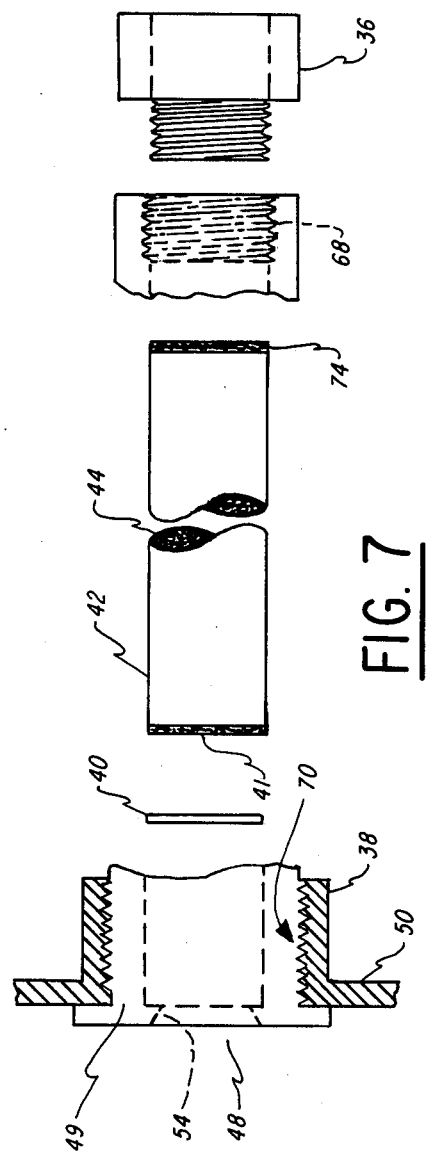
FIG. 7 is an exploded view of a third embodiment of the present invention.
Figure 9:
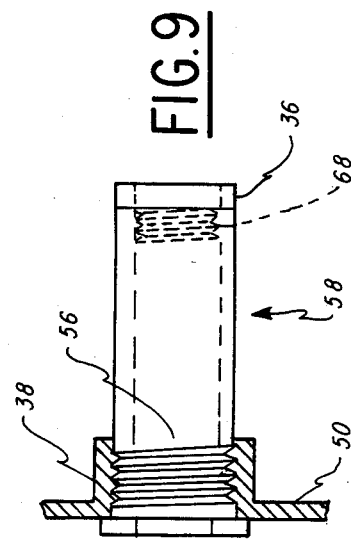
FIG. 9 is a side elevational view of the filtering apparatus shown in FIG. 7 in assembled form.
Figure 8:
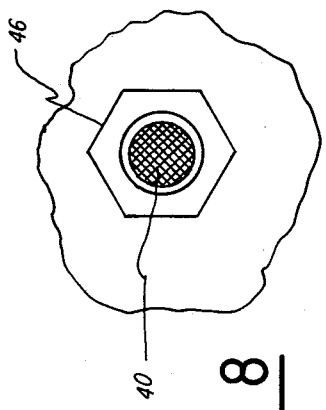
FIG. 8 is a front elevational view of the entry portion of the filtering apparatus; shown in FIG. 7.

Referring to FIGS. 4 through 9, the mounting means includes an elongated tube to encapsulating the screen 40 and container 42 in a uniting series arrangement. The end of the inner cavity of the tube which is not adjacent to the screen is threaded for engaging a detachable end cap 36. The removable end cap provides for easy removal of the container when the desiccant needs changing. The mounting means also includes a tubular flange 38 secured to the enclosure side and extending into the enclosure through the aperture. The inner cavity of the flange is threaded 70 for detachably engaging a threaded portion 56 formed on the end, the elongated tube 58 including the screen 40 and the container 42 of dehydrating material 44. The end of the tube opposite the detachable end cap 36 may be flush with the exterior surface of the enclosure as shown in FIG. 6 or may slightly protrude as shown in FIG. 9. The outside flange portion of the means may be circular as shown in FIGS. 11 and 14, hexagonal as shown in FIGS. 5 and 8, or any other shape appropriate for gripping onto when removing the apparatus from the instrument.

In the embodiment shown in FIG. 13, the container 64 of dehydrating material 44 is formed with a mesh screen 40 at the end adjacent to the aperture, thereby eliminating the need for a separate screen and thus reducing the number of components. The container means serves both as the container of dehydrating material as in the other embodiments as well as serving as a mounting means. It has a detachable end opposite the screen so as to be able to replace the dehydrating material when needed.

Because the air-filtering apparatus 24 provides for a controlled air flow into and out of the instrument, there is no longer a need to seal the instrument as tightly as possible. Although a seal is still required the former method of using strong seals between the removable parts of the instrument housing as well as the need for an abundance of screws to connect the removal parts in order to assure a tight fit, can now be modified with a less critical assembly. Several economic advantages result from taking this different approach to hermetically sealing the instrument. Because there is no longer a need for an air tight fit, a cheaper and less stronger seals may be used. Also, the necessity of frequently changing the seals 22 is no longer present, thereby reducing the cost of maintenance. The invention further allows for the equalization of internal and external pressures about the instrument, thus the gauge of metal of the instrument housing can be reduced, for the need to control the expansion and contraction of the housing is reduced. In addition, the filtering apparatus is designed to fit within the instrument housing, thereby preserving the instrument's mobility and portability by not hampering it with external parts or connections. Because the instruments with which this filter would be used are often rack-mounted in vehicles or carried by back pack, the need for portability is important.

Although the prior description has been concentrating on the process of removing (filtering) moisture from the air, It should, however, be understood that the filter will also filter dust, sand and other similar particles, providing a dual function.

What is claimed is:

1. A dehydrating air-filtering apparatus for radio frequency communications equipment contained within a sealed enclosure comprising:
   means defining an aperture formed in one of the sides of the enclosure, other than the top side;
   a screen having a mesh size that is adapted to condense moisture contained in the air flow there through;
   a container having a dehydrating material therein, being formed to allow air passage through said dehydrating material; and
   mounting means for detachably securing said screen and container to said enclosure in a series arrangement with said aperture for providing a controlled path for air flow into and out of said enclosure serially through said screen and said dehydrating material, and with said container extending within said enclosure, said screen being positioned adjacent to said aperture so that any condensed moisture formed on said screen tends to flow off said screen and exterior to said enclosure, wherein said filtering apparatus removes moisture from the air passing into the enclosure through the controlled path.

2. Air-filtering apparatus as set forth in claim 1, wherein said mounting means includes:
   a clip engaging an internal flange extending through said aperture and located within said enclosure which secures said screen and said container within said internal flange.

3. Air-filtering apparatus as set forth in claim 2, wherein:
   said container has an indentation about the exterior near the end which is positioned adjacent to the screen, said indentation is circular and perpendicularly oriented to the length of said container and adapted to be engaged with said clip.

4. Air-filtering apparatus as set forth in claim 3, wherein said filter means includes:
   a sealing member positioned between said enclosure and said screen.

5. Air-filtering apparatus as set forth in claim 1, wherein said mounting means includes:
   an elongated tube that encapsulates said screen and said container with the end of the tube opposite said screen having a detachable end cap formed with an axial opening, so that said screen and said container are retained in said tube by said end cap.

6. Air-filtering apparatus as set forth in claim 5, wherein said mounting means includes:
a flange secured to the side of said enclosure and extending into said enclosure through said aperture, said flange being formed with a circular opening extending axially there through for securing said elongated tube in place within the enclosure.

7. Air-filtering apparatus as set forth in claim 6, wherein
said flange includes a threaded portion in said circular opening, and
Said elongated tube included a thread portion for a screw connection with said flange.

8. Air-filtering apparatus as set forth in claim 5, wherein the end of said elongated tube opposite the detachable end cap is formed into a hex nut.

9. Air-filtering apparatus as set forth in claim 5, wherein said mounting means includes:
a pin positioned exterior to said enclosure engaging a flange portion extending through the aperture and beyond the exterior of said enclosure, said pin securing said screen and said container to said flange when engaged.

10. Air-filtering apparatus as set forth in claim 12, wherein resilient means is positioned between said screen and said container.

11. Air-filtering apparatus as set forth in claim 9, wherein said container of dehydrating material is formed with a detachable end so that said dehydrating material can be replaced when necessary.

12. Air-filtering apparatus as set forth in claim 1, wherein said mounting means includes a beveled portion between said screen and the end of said mounting means, so that water droplets formed on said screen flow off said screen and along said beveled edges to the exterior of said enclosure.

13. Air-filtering apparatus as set forth in claim 1, wherein said mounting means is recessed relative to said side of said enclosure so that it does not extend beyond the exterior side.

14. A dehydrating air-filtering apparatus for radio frequency communications equipment contained within a sealed enclosure comprising:
means defining an aperture formed in one of the sides of said enclosure other than the top;
container means detachably secured in said aperture and wholly extending within said enclosure, said container means containing a dehydrating material which is retained within said means at one end by a mesh screen and a detachable end cap at the other end, said container means being positioned in series with said aperture for providing a controlled path of air flow into and out of the otherwise sealed enclosure serially through said mesh screen and said dehydrating material, said screen having a mesh size that is adapted to condense moisture contained in the air flowing there through, and is positioned adjacent to said aperture so that the condensed moisture flows down said screen and exterior of said enclosure.

15. Air-filtering apparatus as set forth in claim 14, wherein:
a flange is secured to the side of said enclosure and extending into said enclosure through said aperture, said flange being formed with a circular opening extending axially there through and detachably securing said container means to the enclosure.

16. Air-filtering apparatus as set forth in claim 15, wherein said flange includes:
a threaded portion with said circular opening to provide a detachable screw connection with a threaded portion in said contained means.

17. Air-filtering apparatus as set forth in claim 16, wherein:
said container means and said flanges are recessed so that they do not extend beyond the exterior side of said enclosure.

18. Air-filtering apparatus as set forth in claim 17, wherein:
the circular opening in said container means is beveled between said screen and the flange so that water droplets formed on said screen will flow off said screen and along said beveled edges to the exterior of said enclosure.

19. Radio frequency communication apparatus comprising:
a sealed enclosure;
means defining an aperture formed in one of the sides of said enclosure, other than the top side;
a screen having a mesh size that is adapted to condense moisture contained in the air flow therethrough;
a container having a dehydrating material therein, being formed to allow air passage through said dehydrating material; and
mounting means for detachably securing said screen and said container to said enclosure in a series arrangement with said aperture for providing a controlled path for air flow into and out of said enclosure through said screen and said dehydrating material, and with said container extending within said enclosure, said screen being positioned adjacent to said aperture so that any condensed moisture formed on said screen tends to flow off said screen and exterior to said enclosure, wherein said filtering apparatus removes moisture from the air passing into said enclosure through the controlled path.

* * * * *